US012489447B2

United States Patent
Mangaser et al.

(10) Patent No.: US 12,489,447 B2
(45) Date of Patent: Dec. 2, 2025

(54) MULTI-PHASE CLOCK GATING WITH PHASE SELECTION

(71) Applicant: Advanced Micro Devices, Inc., Santa Clara, CA (US)

(72) Inventors: Ramon Mangaser, Arlington, MA (US); Pradeep Jayaraman, San Jose, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 406 days.

(21) Appl. No.: 18/092,222

(22) Filed: Dec. 31, 2022

(65) Prior Publication Data

US 2024/0223192 A1 Jul. 4, 2024

(51) Int. Cl.
*H03L 7/07* (2006.01)
*H03L 7/081* (2006.01)

(52) U.S. Cl.
CPC ............. *H03L 7/07* (2013.01); *H03L 7/0814* (2013.01); *H03L 7/0816* (2013.01)

(58) Field of Classification Search
CPC ..... H03L 7/00; H03L 7/06; H03L 7/07; H03L 7/08; H03L 7/0802; H03L 7/083; H03L 7/081; H03L 7/0812; H03L 7/0814; H03L 7/0816; H03L 2207/00; H03L 2207/18
See application file for complete search history.

(56) References Cited

U.S. PATENT DOCUMENTS

| | | | | |
|---|---|---|---|---|
| 5,557,762 A * | 9/1996 | Okuaki | ............... | G06F 11/3648 714/34 |
| 5,627,841 A * | 5/1997 | Nakamura | ..... | G01R 31/318586 714/724 |
| 5,760,816 A * | 6/1998 | Morrison | ........... | G06K 15/1219 347/237 |
| 5,805,089 A * | 9/1998 | Fiedler | .................... | H03M 9/00 341/101 |
| 5,886,904 A * | 3/1999 | Dai | ........................ | G06F 30/331 703/14 |
| 6,202,185 B1 * | 3/2001 | Lee | ................ | G01R 31/318558 324/73.1 |
| 6,239,633 B1 * | 5/2001 | Miyano | ..................... | H03L 7/07 327/158 |
| 6,246,737 B1 * | 6/2001 | Kuglin | .................... | G04F 10/06 455/260 |
| 6,247,138 B1 * | 6/2001 | Tamura | ................. | H04L 7/0337 713/400 |
| 6,373,911 B1 * | 4/2002 | Tajima | .................. | H04L 7/0338 398/154 |
| 6,426,662 B1 * | 7/2002 | Arcus | .................. | H03K 3/0322 327/295 |
| 6,457,161 B1 * | 9/2002 | Nadeau-Dostie | ....... | G06F 30/33 716/108 |

(Continued)

*Primary Examiner* — James M Perez
(74) *Attorney, Agent, or Firm* — Polansky & Associates, P.L.L.C.; Paul J. Polansky; Nathan H. Calvert

(57) ABSTRACT

A multi-phase clock gating circuit receives a plurality of respective phased clock signals, and a one-hot stop phase select signal indicating a first selected phase for which gating of the phased clock signals is to be started. Responsive to a clock control signal indicating the phased clock signals are to be gated, the clock signals are gated beginning at the first selected phase, in order of phase, including looping from a last phase to a first phase.

20 Claims, 6 Drawing Sheets

(56) References Cited

U.S. PATENT DOCUMENTS

| | | | | |
|---|---|---|---|---|
| 6,509,773 B2* | 1/2003 | Buchwald | | H04L 7/0337 |
| | | | | 327/248 |
| 6,782,486 B1* | 8/2004 | Miranda | | H03L 7/00 |
| | | | | 713/601 |
| 6,807,244 B2* | 10/2004 | Kawasaki | | H03L 7/0998 |
| | | | | 375/376 |
| 6,987,825 B1* | 1/2006 | Yoshimura | | H03K 5/135 |
| | | | | 327/144 |
| 7,016,441 B1* | 3/2006 | Naoe | | H04L 7/0338 |
| | | | | 375/354 |
| 7,242,733 B2* | 7/2007 | Iwata | | H03L 7/0805 |
| | | | | 375/376 |
| 7,492,849 B2* | 2/2009 | On | | H03D 13/004 |
| | | | | 327/158 |
| 8,351,559 B1* | 1/2013 | Thomas | | H03L 7/00 |
| | | | | 375/354 |
| 8,675,428 B2* | 3/2014 | Choi | | H03L 7/0814 |
| | | | | 365/194 |
| 8,786,333 B2* | 7/2014 | Lin | | H03L 7/0814 |
| | | | | 327/156 |
| 8,860,513 B1* | 10/2014 | Chong | | H03K 3/0322 |
| | | | | 331/172 |
| 9,077,315 B2* | 7/2015 | Bogdan | | H04L 25/0398 |
| 9,374,250 B1 | 6/2016 | Musah | | H04L 25/14 |
| 9,564,880 B2* | 2/2017 | Stengel | | H03K 5/00006 |
| 9,625,938 B2* | 4/2017 | Thazhatheppattu | | G06F 1/10 |
| 9,832,006 B1* | 11/2017 | Bandi | | G06F 1/10 |
| 10,326,625 B1* | 6/2019 | Nedovic | | H04L 25/0276 |
| 10,382,051 B2* | 8/2019 | Matsuzawa | | H03M 1/123 |
| 10,511,315 B1* | 12/2019 | Sarda | | H03K 23/667 |
| 10,530,370 B1* | 1/2020 | Mohan | | H03K 5/135 |
| 10,530,376 B2* | 1/2020 | Chong | | H03L 7/24 |
| 10,541,691 B1* | 1/2020 | Kossel | | H03L 7/085 |
| 10,651,836 B1* | 5/2020 | Kale | | H03K 23/54 |
| 11,031,939 B1* | 6/2021 | Wolkovitz | | H03L 7/0807 |
| 11,038,602 B1* | 6/2021 | Sun | | H04B 17/21 |
| 11,079,723 B2* | 8/2021 | Chu | | H03K 21/38 |
| 11,115,040 B1* | 9/2021 | Xu | | H03M 1/121 |
| 11,264,999 B2* | 3/2022 | Jennings | | H03K 21/10 |
| 11,784,650 B2* | 10/2023 | Wei | | H03L 7/083 |
| | | | | 327/158 |
| 11,784,890 B2* | 10/2023 | Kumar | | H04B 3/46 |
| | | | | 709/220 |
| 11,909,404 B1* | 2/2024 | Chu | | H03L 7/087 |
| 2003/0067333 A1* | 4/2003 | Nakamura | | H04L 7/0337 |
| | | | | 327/158 |
| 2003/0179028 A1* | 9/2003 | Kizer | | H03L 7/0805 |
| | | | | 327/158 |
| 2004/0080349 A1* | 4/2004 | Kawahito | | H03L 7/0816 |
| | | | | 327/158 |
| 2005/0237040 A1* | 10/2005 | Rice | | H02M 3/1584 |
| | | | | 323/282 |
| 2005/0264337 A1* | 12/2005 | Berkram | | G06F 1/06 |
| | | | | 327/291 |
| 2005/0264338 A1* | 12/2005 | Berkram | | H03L 7/06 |
| | | | | 327/291 |
| 2007/0086555 A1* | 4/2007 | Cho | | H03K 5/133 |
| | | | | 375/376 |
| 2009/0300388 A1* | 12/2009 | Mantor | | G06F 1/10 |
| | | | | 713/600 |
| 2010/0007389 A1* | 1/2010 | Li | | H03L 7/0814 |
| | | | | 327/147 |
| 2012/0319749 A1* | 12/2012 | Thaller | | H03L 7/183 |
| | | | | 327/158 |
| 2013/0002318 A1* | 1/2013 | Lu | | H03L 7/099 |
| | | | | 327/156 |
| 2013/0120036 A1* | 5/2013 | Zhu | | H03L 7/0802 |
| | | | | 327/156 |
| 2013/0135015 A1* | 5/2013 | Hossain | | H03K 3/0315 |
| | | | | 327/116 |
| 2013/0200931 A1* | 8/2013 | Kono | | H03H 11/16 |
| | | | | 327/147 |
| 2013/0214835 A1* | 8/2013 | Uo | | H03L 7/095 |
| | | | | 327/157 |
| 2013/0329843 A1* | 12/2013 | Takeuchi | | H03L 7/085 |
| | | | | 375/375 |
| 2014/0118038 A1* | 5/2014 | Lin | | H03L 7/0814 |
| | | | | 327/149 |
| 2014/0204988 A1* | 7/2014 | Wei | | H04L 7/0087 |
| | | | | 375/226 |
| 2014/0333346 A1* | 11/2014 | Bae | | H03L 7/0995 |
| | | | | 327/5 |
| 2016/0004273 A1* | 1/2016 | Chiang | | G06F 1/08 |
| | | | | 713/503 |
| 2016/0041579 A1* | 2/2016 | Ali | | H04B 15/00 |
| | | | | 713/400 |
| 2016/0191066 A1* | 6/2016 | Potty | | H03L 7/0818 |
| | | | | 327/159 |
| 2018/0191335 A1* | 7/2018 | Shan | | H03L 7/18 |
| 2018/0254882 A1* | 9/2018 | Bogdan | | H03L 7/22 |
| 2019/0097642 A1* | 3/2019 | Li | | H03L 7/08 |
| 2020/0099507 A1* | 3/2020 | Shinmyo | | H04L 7/0087 |
| 2020/0106450 A1* | 4/2020 | Payne | | H03L 7/0996 |
| 2021/0143807 A1* | 5/2021 | Kim | | H03L 7/0893 |
| 2021/0271288 A1* | 9/2021 | Seo | | G06F 1/10 |
| 2021/0305989 A1* | 9/2021 | Han | | H03L 7/07 |
| 2022/0140832 A1* | 5/2022 | Song | | H03L 7/0814 |
| | | | | 327/158 |
| 2023/0082056 A1* | 3/2023 | Han | | G06F 1/10 |
| 2023/0121503 A1* | 4/2023 | Wei | | H03L 7/183 |
| | | | | 327/158 |
| 2024/0223192 A1* | 7/2024 | Jayaraman | | H03K 5/135 |

* cited by examiner

MULTI-PHASE CLOCK GATING WITH PHASE SELECTION

BACKGROUND

Synchronous circuits, such as phase interpolators used in integrated circuits physical layer circuit (PHY) receivers, often employ a clock signal with multiple phases. Such a multi-phase clock signal may be produced by an oscillator circuit and fed to the various circuits that use the clock through a clock tree. The clock tree typically includes clock gates which gate the clock signal when the synchronous circuit is not needed.

When the clock signal is ungated and the synchronous circuit is started again, it needs to synchronize to an exact known clock edge of the clock signal in order to perform its function. Such a synchronization process often requires a time-consuming re-initialization of circuitry such as finite state machines, buffers, and the like. Further, a phase interpolator tracks phase drift over a communication link due to temperature changes, voltage changes, and changes in various conditions. The phase interpolator adjusts its use of the multi-phase clock to maintain a lock on the received signal. When re-initialization occurs, the prior phase adjustments are typically lost even if the clock gating period was relatively short.

Figure 1:
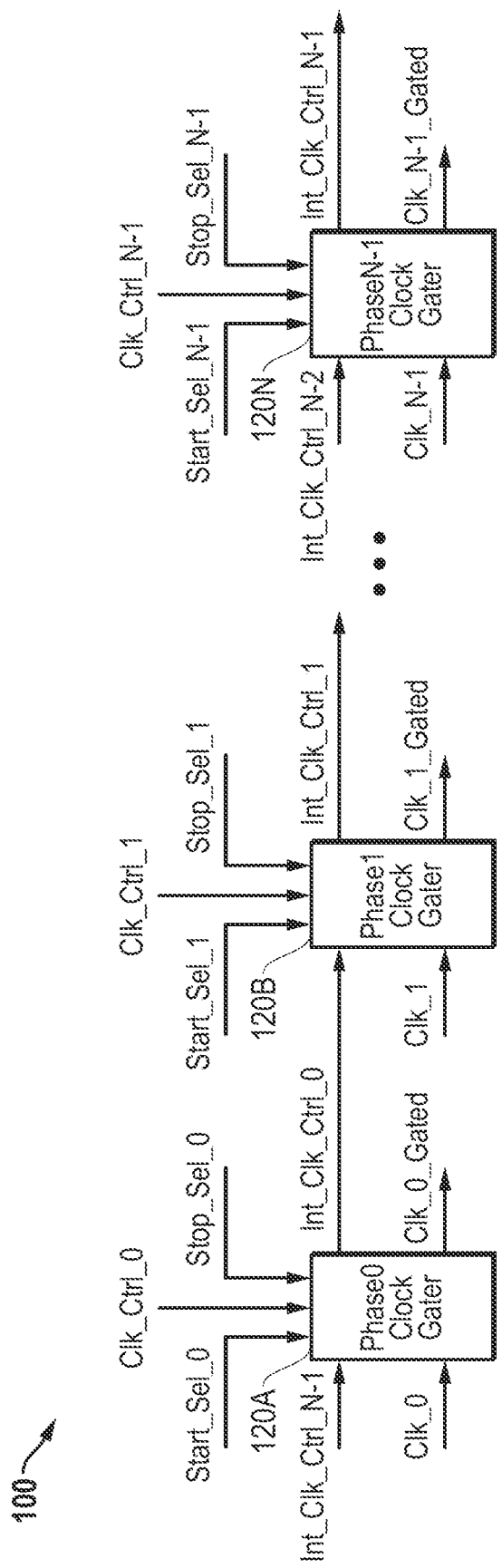
FIG. 1 illustrates in block diagram form a multi-phase clock gater circuit according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A multi-phase clock gater circuit includes four or more phased clock inputs each receiving a respective phased clock signal, and four or more phased clock outputs each selectively providing a respective version of the phased clock signals, four or more stop phase select inputs each receiving a respective one-hot stop phase select signal, and a clock gater control input receiving a clock control signal. The multi-phase clock gater circuit includes clock gater circuitry operable to stop providing the respective versions of the respective phased clock signals in a sequential order beginning with a respective phased clock signal indicated by the one-hot stop phase select signals, responsive to a first value of the clock control signal.

A method is provided for gating a multi-phase clock signal. The method includes receiving a plurality of respective phased clock signals, and receiving a one-hot stop phase select signal indicating a first selected phase for which gating of the phased clock signals is to be started. Responsive to a clock control signal indicating the phased clock signals are to be gated, beginning at the first selected phase, gating all of the phased clock signals in order of phase including looping from a last phase to a first phase.

An integrated circuit includes a multi-phase clock generator and a plurality of multi-phase clock gater circuits. The multi-phase clock generator generates a multi-phase clock signal. The plurality of multi-phase clock gater circuits are for selectably providing the multi-phase clock signal to digital circuits on the integrated circuit. Each of the multi-phase clock gater circuits includes four or more phased clock inputs each receiving a respective phased clock signal, and four or more phased clock outputs each selectively providing a respective version of the phased clock signals, four or more stop phase select inputs each receiving a respective one-hot stop phase select signal, and a clock gater control input receiving a clock control signal. Each multi-phase clock gater circuit includes clock gater circuitry operable to stop providing the respective versions of the respective phased clock signals in a sequential order beginning with a respective phased clock signal indicated by the one-hot stop phase select signals, responsive to a first value of the clock control signal.

FIG. 1 illustrates in block diagram form a multi-phase clock gater circuit 100 according to some embodiments. Multi-phase clock gater circuit 100 includes four or more clock gaters 120A-120N (labeled "Phase0 Clock Gater", "Phase1 Clock Gater" through "PhaseN–1 Clock Gater") for gating respective phased clock signals. Each clock gater 120A-120N includes phased clock input receiving a respective phased clock signal labeled "Clk_0", "Clk_1" through "Clk_N–1", which receive the phased clock signals to be gated. N is the number of clock phases in the multi-phase clock signals, such as four or eight, for example. Each clock gater 120A—120N includes a phased clock output selectively providing a respective version of the phased clock signals (labeled "Clk_0_Gated", "Clk_1_Gated" through "Clk_N_Gated"), which is slightly delayed and is gated or not depending on the operation of the clock gaters 120A—120N.

Each clock gater 120A-120N has a control input receiving a clock control signal, labeled "Clk_Ctrl_0", "Clk_Ctrl_1", through "Clk_Ctrl_N–1", which is an original gating control signal for each phase. Each clock gater 120A-120N includes an internal clock control input, for receiving an internal clock control signal labeled "Int_Clk_Ctrl_N–1", "Int_Clk_Ctrl_0" through "Int_Clk_Ctrl_N–2". Each clock gater 120A-120N includes an internal clock control output for providing a version of the internal clock control signal. The internal clock control input of each clock gater is connected to the internal clock control output of the clock gater for a prior phase, with the internal clock control input of an initial one of the clock gaters 120A connected to the internal clock control output of a final one of the clock gaters 120N.

Each clock gater 120A-120N includes a stop phase select inputs each receiving a respective one-hot stop phase select signal labeled "Stop_Sel_0", "Stop_Sel_1", through "Stop_Sel_N–1", for selecting the desired phase on which to begin gating, or "stop", the multi-phase clock signal. Each clock gater 120A-120N includes a respective one-hot start phase select inputs each receiving a respective one-hot start phase select signal, labeled "Start_Sel_0", "Start_Sel_1", through "Start_Sel_N−1", for selecting the desired phase on which to end the gating, or "start" the multi-phase clock signal.

Generally, clock gaters 120A—120N include clock gater circuitry operable together to stop providing the respective versions of the respective phased clock signals in a sequential order beginning with a respective phased clock signal indicated by the one-hot stop phase select signals, responsive to a first value of the clock control signal. The clock gater circuitry is further operable to start providing the respective versions of respective phased clock signals in a sequential order beginning with a respective phased clock signal indicated by the one-hot start phase select signals, responsive to a second value of the clock control signal.

Figure 2:
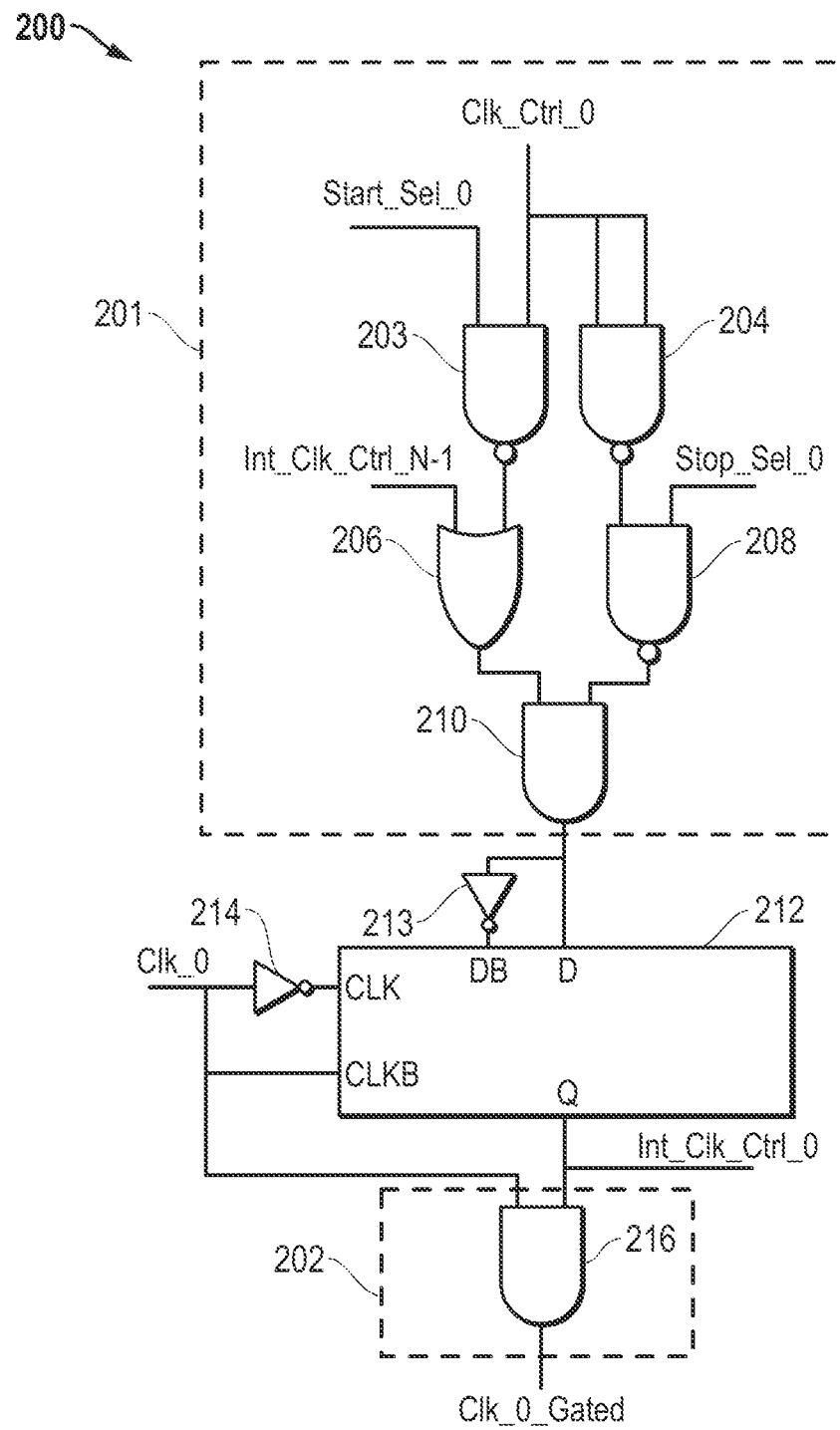
FIG. 2 illustrates in circuit diagram form a clock gater according to some embodiments.

FIG. 2 illustrates in circuit diagram form a clock gater 200 according to some embodiments. Clock gater 200 is generally implemented in an integrated circuit and is suitable for use in multi-phase clock gater circuit 100 of FIG. 1, and other multi-phase clock gater circuits. Clock gater 200 is shown with signals for gating a Phase 0 clock signal (similarly to clock gater 120A of FIG. 1). The same circuit configuration may be used for each of the clock gaters of a multi-phase clock gater circuit by using connections as depicted in FIG. 1. Clock gater 200 generally includes a latch circuit 212, and a first combinatorial logic circuit 201, and a second combinatorial logic circuit 202.

First combinatorial logic circuit 201 is configured to generate a latch input to signal, which is fed to a "D" terminal of latch circuit 212. The latch input signal is based on a respective phase-specific version of the clock control signal (Clk_Crl_0), a respective one-hot start phase select signal (Start_Sel_0), a respective one-hot stop phase select signal (Stop_Sel_0), and a respective internal clock control signal (Int_Clk_Ctrl_N−1) from a prior one of the clock gaters. In this embodiment, first combinatorial logic circuit 201 includes three NAND gates 203, 204, and 208, an OR gate 206, and an AND gate 210. Various other combinatorial logic circuits may provide the same logical function. NAND gate 203 has two inputs receiving the Clk_Crl_0 and Start_Sel_0 signals, respectively, and an output. NAND gate 204 is connected as an inverter with two inputs both receiving the Clk_Ctrl_0 signal, and an output. NAND gate 208 has a first input connected to the output of NAND gate 204, a second input receiving the Stop_Sel_0 signal, and an output. OR gate 206 has a first input connected to the output of NAND gate 203, a second input receiving the Int_Clk_N−1 signal, and an output. AND gate 210 has a first input connected to the output of OR gate 206, a second input connected to the output of NAND gate 208, and an output connected to the D terminal of latch circuit 212. An inverter 213 is also shown with an input connected to the output of AND gate 210 and an output connected to a "DB" terminal of latch circuit 212.

Latch circuit 212 includes the D input terminal, the DB input terminal, a "CLK" input terminal, a "CLKB" input terminal, and a "Q" output terminal. Latch circuit configured to generate the respective internal clock control signal (Int_Clk_Ctrl_0 in this example) based on the latch input signal and the respective phased clock signal (Clk_0), and feed it to the Q output terminal. An inverter 214 provides an inverted version of the respective phased clock signal (Clk_0) to the D input terminal, while the respective phased clock signal is fed to the DB input terminal. Latch circuit 212 may be implemented as a D-type flip-flop or other suitable latch circuit.

Second combinatorial logic circuit 202 includes an AND gate 216 with a first input receiving the respective phased clock signal (Clk_0), a second input connected to the Q output of latch circuit 212, and an output providing a gated version of the respective phased clock signal based on the respective internal clock control signal and the respective phased clock signal.

Figure 3:
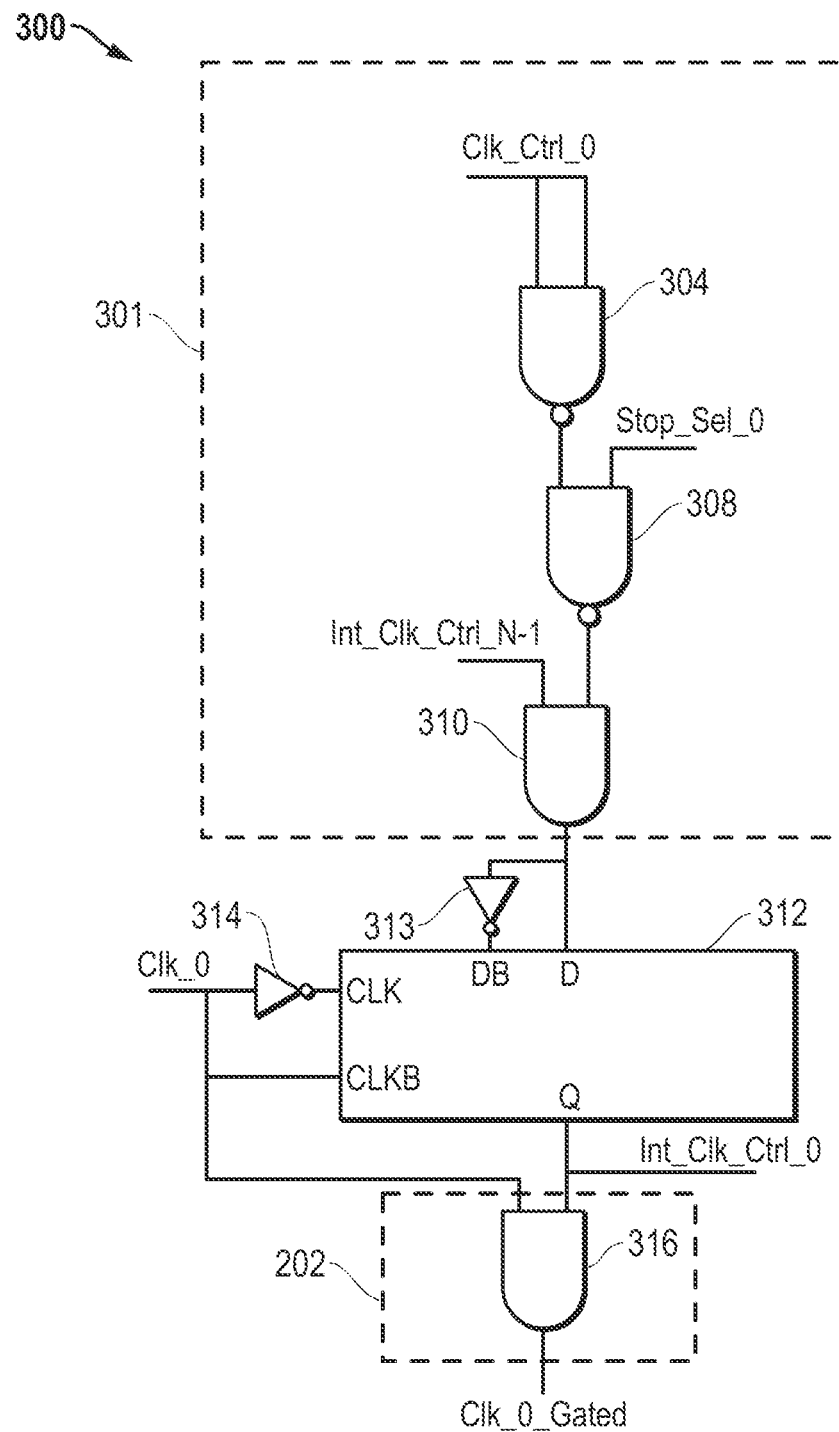
FIG. 3 illustrates in circuit diagram form a clock gater 300 according to some additional embodiments.

FIG. 3 illustrates in circuit diagram form a clock gater 300 according to some additional embodiments. Clock gater 300 is generally implemented in an integrated circuit and is suitable for use in multi-phase clock gater circuits that do not require a start phase select capability. Clock gater 200 generally includes a latch circuit 312, and a first combinatorial logic circuit 301, and a second combinatorial logic circuit 302, generally arranged like those of FIG. 2, but without an input receiving a start phase select signal.

First combinatorial logic circuit 301 is configured to generate a latch input to signal, which is fed to a "D" terminal of latch circuit 312. The latch input signal is based on a respective phase-specific version of the clock control signal (Clk_Crl_0), a respective one-hot stop phase select signal (Stop_Sel_0), and a respective internal clock control signal (Int_Clk_Ctrl_N−1) from a prior one of the clock gaters. First combinatorial logic circuit 301 includes three NAND gates 304 and 308, and an AND gate 310. Various other combinatorial logic circuits may provide the same logical function. NAND gate 304 is connected as an inverter with two inputs both receiving the Clk_Ctrl_0 signal, and an output. NAND gate 308 has a first input connected to the output of NAND gate 304, a second input receiving the Stop_Sel_0 signal, and an output. AND gate 310 has a first input receiving a respective internal clock control signal (Int_Clk_Ctrl_N−1), a second input connected to the output of NAND gate 308, and an output connected to the D terminal of latch circuit 312. An inverter 313 has an input connected to the output of AND gate 310 and an output connected to a "DB" terminal of latch circuit 312.

Latch circuit 312 includes the D input terminal, the DB input terminal, a "CLK" input terminal, a "CLKB" input terminal, and a "Q" output terminal. Latch circuit configured to generate the respective internal clock control signal (Int_Clk_Ctrl_0 in this example) based on the latch input signal and the respective phased clock signal (Clk_0), and feed it to the Q output terminal. An inverter 314 provides an inverted version of the respective phased clock signal (Clk_0) to the D input terminal, while the respective phased clock signal is fed to the DB input terminal.

Second combinatorial logic circuit 302 includes an AND gate 316 with a first input receiving the respective phased clock signal (Clk_0), a second input connected to the Q output of latch circuit 312, and an output providing a gated version of the respective phased clock signal based on the respective internal clock control signal and the respective phased clock signal.

Figure 4:
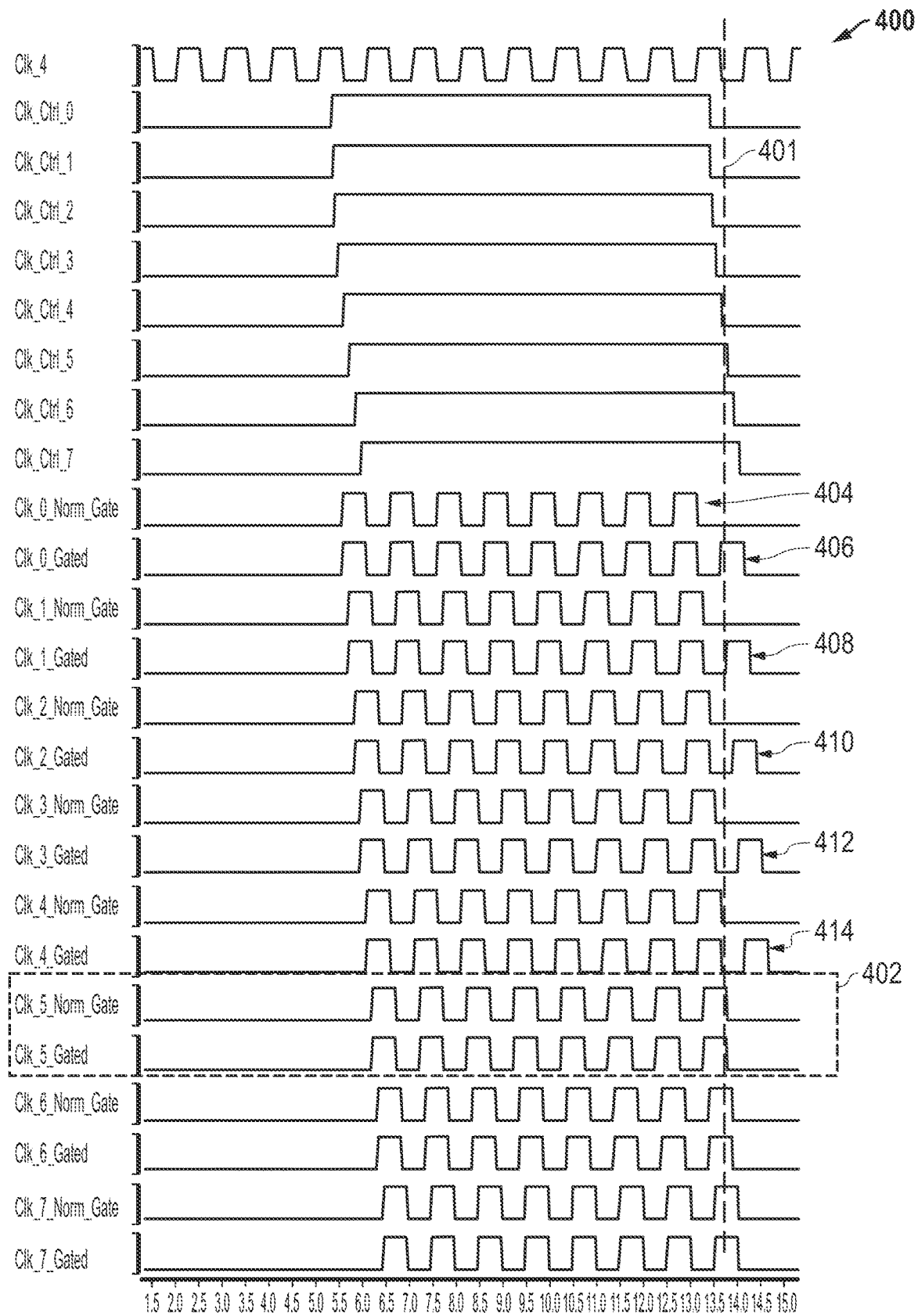
FIG. 4 shows a timing diagram 400 comparing operation of a normal multi-phase clock gater to a multi-phase clock gater with stop selection like that shown in any of FIGS. 1-3.

FIG. 4 shows a timing diagram 400 comparing operation of a normal multi-phase clock gater to a multi-phase clock gater with stop selection like that shown in FIGS. 1-3. Signals illustrating the gating operation are shown with the signal voltage level on the vertical axis and time on the horizontal axis. Timing diagram 400 illustrates operation of a normal clock gate for a multi-phase clock compared to operation of a multi-phase clock gater with a selectable stop phase as described above. In this example, an 8-phase clock is used (Clk_0 through Clk_7), with phases spaced evenly at 45-degree intervals. The multi-phase clock gater circuit includes eight clock gaters connected together as shown in FIG. 1.

Depicted from the top down are the clock signal for Clk_4, the 180-degree clock, the clock control signals fed to each clock phase in order, with Clk_Ctrl_0 through Clk_Ctrl_7. In this normal operation, which may be replicated by selecting Phase0 as the stop phase in the embodiments herein, Clk_Ctrl_0 signal may received as the gating signal and cascade through various clock gaters, or all clock gaters may be fed individual clock control signals. In either case, a normal multi-phase gating operation has the effect of gating the multiphase clock starting with Phase0. Below the clock control signals are shown the gated phased clock signals, with pairs for each phase showing a gated clock signal that results from a normal clock gate, labeled "Clk_0_Norm_Gate" through "Clk_7_Norm_Gate", and then the gated signal for the respective clock gater using a multi-phase clock gater circuit as described herein, labeled "Clk_0_Gated" through "Clk_7_Gated".

In this example scenario, the one-hot stop select signal is set to select the sixth phase (Clk_5), which is 225 degrees following the zero-phase clock, and is highlighted by the dotted box 402. A dotted line 401 shows falling edge of Clk_5 after which the multi-phase clock gater will begin gating phases. As can be seen, the clock phases Clk_5 include an extra clock cycle, because gating is begun at the fifth phase. At point 404, a normal gated clock signal for Clk_0 is stopped under control of Clk_Ctrl_0. At point 406, the Clk_0_Gated signal includes an extra clock cycle, because the internal clock control signal for the Phase0 Clock Gater has not propagated through the multi-phase clock gater circuit 100 to the Phase0 Clock Gater. Similarly the Clk_1_Gated, Clk_2_Gated, Clk_3_Gated, and Clk_4_Gated signals are seen to have an additional clock cycle at points 408, 410, 412, and 414, respectively. Then in dotted box 402, the Clk_5_Gated signal begins gating at the selected Phase5, and the Clk_5_Norm_Gate signal matches the Clk_5_Gated signal, along with the following phases through the bottom of the diagram.

A similar effect is achieved for starting an already-gated clock on a selected phase using the one-hot start select signal (e.g., Start_Sel_N, FIG. 1, FIG. 2). A different start and stop phase may be selected using the techniques herein, or the same start and stop phase. This advantage over normal clock gating techniques allows synchronous circuits employing multiple clock phases, such as phase interpolators, to select their start and stop phases and avoid lengthy clock synchronization processes when restarting after any modes in which clocks are gated.

Figure 5:
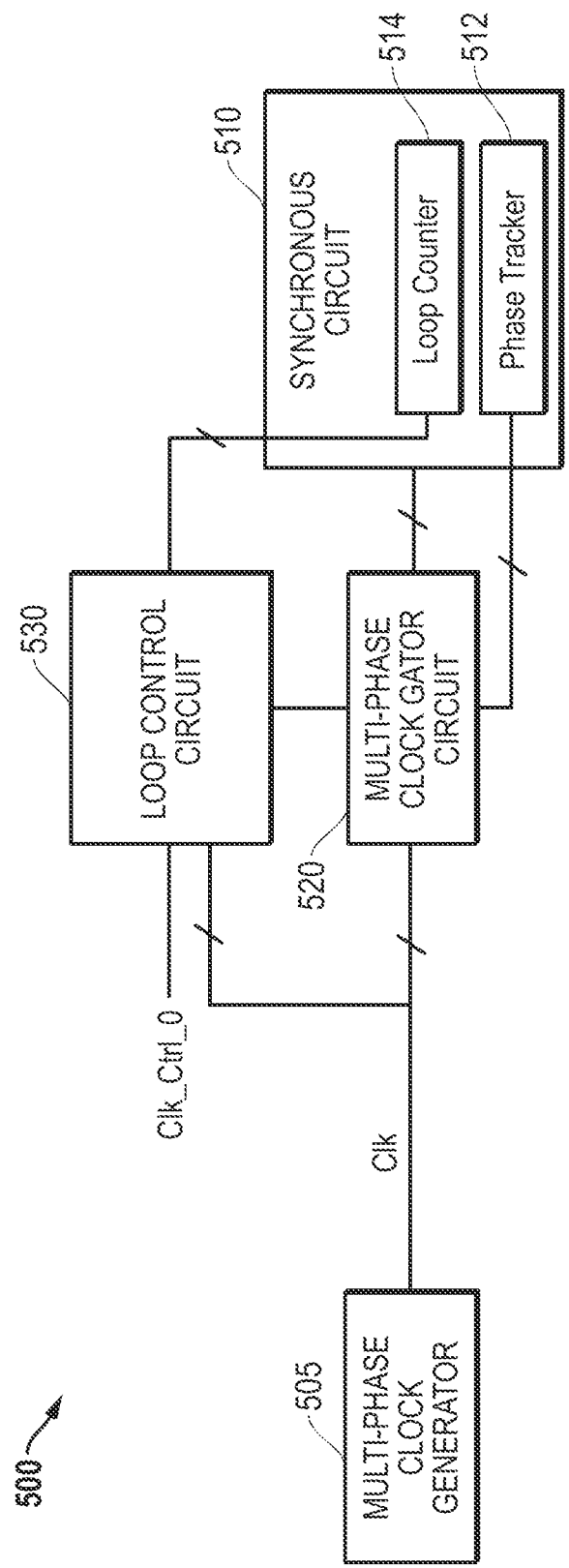
FIG. 5 illustrates in block diagram form a portion of a synchronous system 500 including a synchronous circuit operating on a multi-phase clock and enabling phase tracking through multiple rotations of phase cycles.

FIG. 5 illustrates in block diagram form a portion of a synchronous system 500 including a synchronous circuit operating on a multi-phase clock and enabling phase tracking through multiple rotations of phase cycles. The depicted portion of a synchronous system 500 is embodied on an integrated circuit such as a system-on-chip (SoC), and includes a synchronous circuit 510 fed with a multi-phase clock signal "Clk" generated by a multi-phase clock generator 505. The Clk signal is fed to multiple synchronous circuits which may each include their own gating circuitry like that depicted. The Clk signal is gated with a multi-phase clock gater circuit 520. A loop control circuit 530 is coupled to multi-phase clock gater circuit 520 for enabling selection of specified start and stop phases a specified number of loops away from the current phase of the clock.

Synchronous circuit 510 may be any synchronous circuit that uses a multi-phase clock and selects specific phases of the clock on which to operate. The most common example is a phase interpolator circuit used in receivers of physical layer circuits (PHYs) for communication links such as memory interfaces. Synchronous circuit 510 includes a phase tracker 512 and a loop counter 514. Phase tracker 512 is a register or other circuit which holds a value identifying the clock phase on which synchronous circuit 510 is operating. For example, in a phase interpolator, the phase interpolator circuit adjusts to "drift" in a signal by changing the clock phase on which it operates over time. The change may be increase or decrease the phase at any particular time as the phase interpolator adjusts. Phase tracker 512 tracks the phase currently in use. This value is converted to a one-hot start phase select and one-hot stop phase select signals and fed to multi-phase clock gater circuit 520 for controlling the start and stop phases of gating operations as described above. However, if the phase is adjusted more 360 degrees or more (more than a full rotation), the use of start select and stop select signals does not fully track the adjustments that are made in a manner that allows full synchronization after the clock is ungated.

Loop counter 514 includes circuitry operable to track the number of rotations that are made during phase adjustments. Each time the zero phase is passed by an adjustment in the negative direction (delayed phase), the counter increases. Adjustments are also made when the zero phase is passed in the positive direction to decrease the counter, although if total forward adjustment have been made when clock gating occurs, these cannot always be accounted for. Loop counter 514 has an output connected to loop control circuit 530 for providing the current value of loop counter.

Loop control circuit 530 has an input receiving the clock control signal Clk_Ctrl_0, an input receiving the Clk signal, an input connected to the output of loop counter 514, and an output connected to multi-phase clock gater circuit 520 for passing a delayed version of the Clk_Ctrl_0 signal. Loop control circuit 530 operates to delay the Clk_Ctrl_0 signal by a number of clock cycles equal to the loop counter value provided to it when clock gating occurs. This delay operation allows phase selection to cross the boundary of rotations (at least in the delay direction). The clock control signal Clk_Ctrl_0 is delayed for both starting and stopping the clock, allowing synchronous circuit 510 to exactly reproduce the total phase drift from its prior phase adjustments, by combining the effect of loop control circuit 530 and the start and stop phase selection capability of multi-phase clock gater circuit 520.

Figure 6:
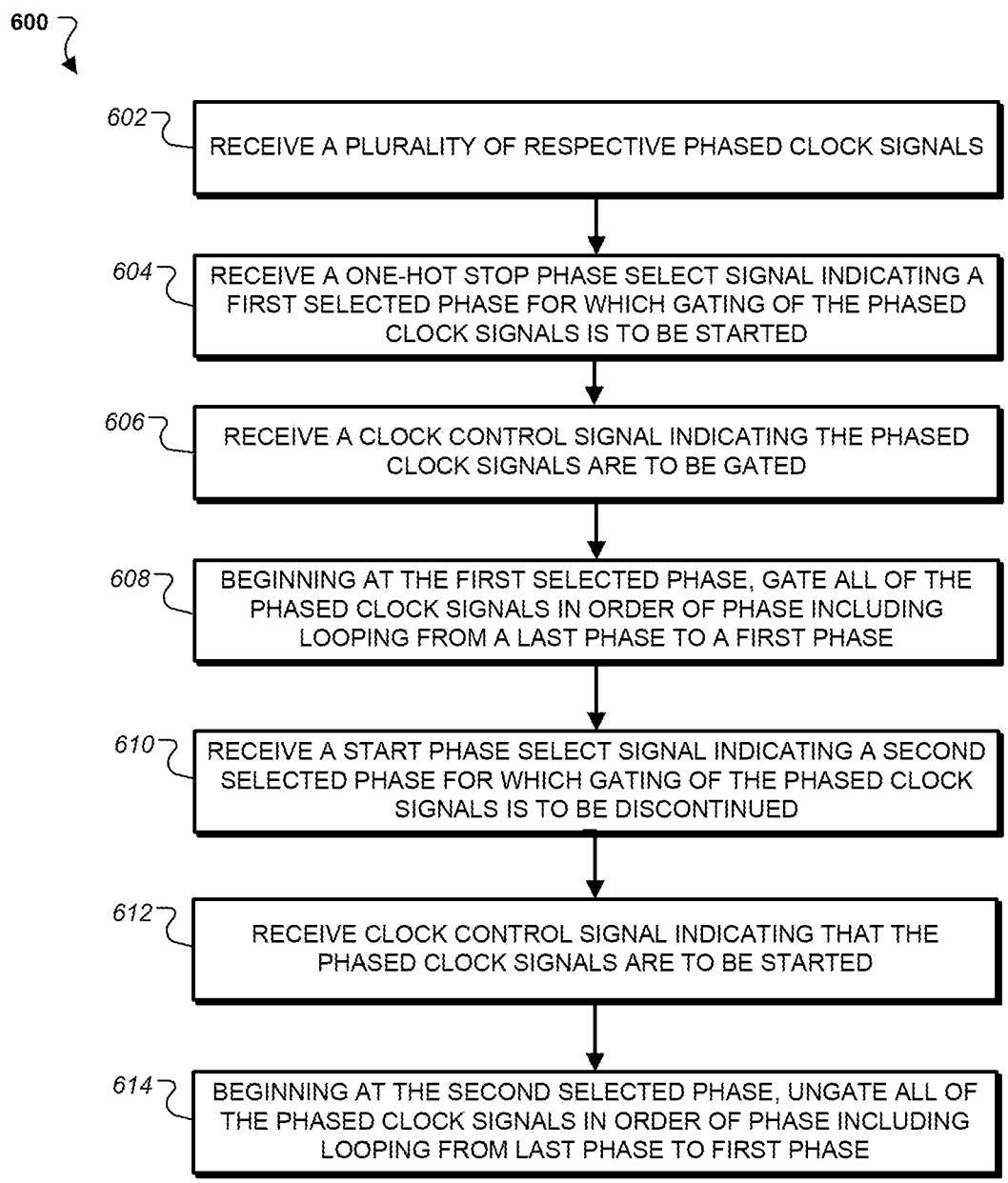
FIG. 6 shows a flow diagram for a process of gating a multi-phase clock signal according to some embodiments.

FIG. 6 shows a flow diagram 600 for a process of gating a multi-phase clock signal according to some embodiments. The depicted process is suitable for use with the circuits of FIG. 1, FIG. 2, and FIG. 5, or other clock gating circuits with similar capabilities.

The process begins at block 602 where it includes receiving a plurality of respective phased clock signals. At block 604, the process receives a one-hot stop phase select signal indicating a first selected phase for which gating of the phased clock signals is to be started. At block 606, the process receives a clock control signal indicating the phased clock signals are to be gated. The clock control signal may include a plurality of respective phase-specific clock control signals each associated with one of the respective phased clock signals, and the process may include feeding the respective phase-specific clock control signals to respective clock gaters for each of the phased clock signals.

Responsive to the clock control signal, at block 608, beginning at the first selected phase, the process includes gating all of the phased clock signals in order of phase including looping from a last phase to a first phase. Block 608 may include generating a respective internal clock control signal at each of the respective clock gaters, and feeding it to a subsequent one of the clock gaters in order of phase with an initial one of the clock gaters receiving the internal clock control signal from a final one of the clock gaters.

While the multiphase clock signal is gated, the process at block 610 includes receiving a start phase select signal indicating a second selected phase for which gating of the phased clock signals is to be discontinued. The start phase select signal may include a plurality of one-hot start phase select signals each fed to a respective one of the clock gaters. At block 612, the clock control signal indicates that the phased clock signals are to be started. Responsive to this clock control signal, beginning at the second selected phase, the process at block 614 includes ungating all of the phased clock signals in order of phase including looping from the last phase to the first phase.

Thus, a multi-phase clock gater circuit and a loop control circuit have been described for enabling a synchronous circuit to control clock gating with start and stop phase selection. This system provides multiple benefits to synchronous systems, allowing clock signals to be gated and ungated without losing the phase synchronization and phase adjustments made before gating. Not only does this greatly reduce the frequency that full clock synchronization processes need to be employed when re-starting gated clocks, but it also provides a lower "cost" in time spent for gating clocks to circuits such as phase interpolators, allowing clock gating to be used more frequently and reducing power consumption.

Multi-phase clock gater circuit 100, synchronous circuit 510, loop control circuit 530, or any portions thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, clock tree structures may be used to distribute the multi-phase clock signal and clock control signals to synchronous circuits, each including a multi-phase clock gater circuit such as those herein.

Accordingly, it is intended by the appended claims to cover all modifications of the disclosed embodiments that fall within the scope of the disclosed embodiments.

What is claimed is:

1. A multi-phase clock gater circuit comprising:
   four or more phased clock inputs each receiving a respective phased clock signal;
   four or more phased clock outputs each selectively providing a respective version of the respective phased clock signal;
   four or more stop phase select inputs each receiving a respective one-hot stop phase select signal;
   a clock gater control input receiving a clock control signal; and
   clock gater circuitry operable to stop providing the respective versions of the respective phased clock signals in a sequential order beginning with a respective phased clock signal indicated by the one-hot stop phase select signals, responsive to a first value of the clock control signal.

2. The multi-phase clock gater circuit of claim 1, further comprising:
   four or more start phase select inputs each receiving a respective one-hot start phase select signal,
   wherein the clock gater circuitry is further operable to start providing the respective versions of the respective phased clock signals in a sequential order beginning with a respective phased clock signal indicated by the one-hot start phase select signals, responsive to a second value of the clock control signal.

3. A multi-phase clock gater circuit of claim 1, wherein the clock gater circuitry comprises:
   four or more clock gaters for gating the respective phased clock signals, each comprising an internal clock control input for receiving an internal clock control signal, and an internal clock control output for providing a version of the internal clock control signal,
   wherein the internal clock control input of each of the clock gaters is connected to the internal clock control output of the clock gater for a respective prior phase, with the internal clock control input of an initial one of the clock gaters connected to the internal clock control output of a final one of the clock gaters.

4. The multi-phase clock gater circuit of claim 3, wherein the clock gaters each further comprise:
   a first terminal receiving the respective phased clock signal;
   a second terminal receiving a respective phase-specific version of the clock control signal;
   a third terminal receiving the respective one-hot stop phase select signal;
   a first combinatorial logic circuit configured to generate a latch input signal based on the respective phase-specific version of the clock control signal, and the respective one-hot stop phase select signal, and a respective internal clock control signal from a prior one of the clock gaters;
   a latch circuit configured to generate the respective internal clock control signal based on the latch input signal and the respective phased clock signal; and
   a second combinatorial circuit configured to generate a gated version of the respective phased clock signal based on the respective internal clock control signal and the respective phased clock signal.

5. The multi-phase clock gater circuit of claim 4, wherein:
   the first combinatorial logic circuit is configured to generate the latch input signal further based on a respective one-hot start phase select signal.

6. A method for gating a multi-phase clock signal, comprising:
   receiving a plurality of respective phased clock signals and providing respective versions of the phased clock signals with a clock gater circuit;

receiving a one-hot stop phase select signal indicating a first selected phase for which the phased clock signals is to be stopped with the clock gater circuit; and responsive to a clock control signal indicating the phased clock signals are to be stopped, beginning at the first selected phase, stopping providing all of the respective versions phased clock signals with the clock gater circuit in order of phase including looping from a last phase to a first phase.

7. The method of claim 6, further comprising:

receiving a start phase select signal indicating a second selected phase for which stopping of the phased clock signals is to be discontinued; and responsive to the clock control signal indicating that the phased clock signals are to be started, beginning at the second selected phase, starting providing all of the respective versions of the phased clock signals in order of phase including looping from the last phase to the first phase.

8. The method of claim 6, wherein:

the clock control signal comprises a plurality of respective phase-specific clock control signals each associated with one of the respective phased clock signals; and the method further comprises feeding the respective phase-specific clock control signals to respective clock gaters of the clock gater circuit for each of the phased clock signals.

9. The method of claim 8, further comprising:

generating a respective internal clock control signal at each of the respective clock gaters, and feeding it to a subsequent one of the clock gaters in order of phase with an initial one of the clock gaters receiving the internal clock control signal from a final one of the clock gaters.

10. The method of claim 9, further comprising:

for each of the clock gaters, generating a latch input signal based on the respective phase-specific clock control signal, the one-hot stop phase select signal, and the respective internal clock control signal;

for each of the clock gaters, generating the respective internal clock control signal based on the latch input signal and the respective phased clock signal; and for each of the clock gaters, generating the respective version of the respective phased clock signal based on the respective internal clock control signal and the respective phased clock signal.

11. The method of claim 10, wherein:

generating a latch input signal for each of the clock gaters is further based on a start phase select signal.

12. The method of claim 11, wherein:

the start phase select signal comprises a plurality of one-hot start phase select signals each fed to a respective one of the clock gaters.

13. The method of claim 6, further comprising:

at a circuit receiving gated phased clock signals, selecting a desired phase of the clock signal with which to operate; and generating the one-hot stop phase select signal based on the desired phase of the clock signal.

14. The method of claim 13, further comprising:

at the circuit receiving the gated phased clock signals, counting a number of times a zero phase boundary is crossed during phase adjustments;

providing the number a number of times a zero phase boundary is crossed during phase adjustments to the clock gater circuit; and at the clock gater circuit, responsive to a clock control signal indicating the phased clock signals are to be gated, before stopping providing all of the respective versions of the phased clock signals in order of phase, allowing a number of phase cycles equal to the number of times a zero phase boundary is crossed during phase adjustments.

15. An integrated circuit, comprising:

a multi-phase clock generator for generating a multi-phase clock signal; and a plurality of multi-phase clock gater circuits for selectably providing the multi-phase clock signal to digital circuits on the integrated circuit, each comprising:

four or more phased clock inputs each receiving a respective phased clock signal;

four or more phased clock outputs each selectively providing a respective version of the respective phased clock signal;

four or more stop phase select inputs each receiving a respective one-hot stop phase select signal;

a clock gater control input receiving a clock control signal; and clock gater circuitry operable to stop providing the respective versions of the respective phased clock signals in a sequential order beginning with a respective phased clock signal indicated by the one-hot stop phase select signals, responsive to a first value of the clock control signal.

16. The integrated circuit of claim 15, wherein each multi-phase clock gater circuit further comprises:

four or more start phase select inputs each receiving a respective one-hot start phase select signal, wherein the clock gater circuitry is further operable to start providing the respective versions of respective phased clock signals in a sequential order beginning with a respective phased clock signal indicated by the one-hot start phase select signals, responsive to a second value of the clock control signal.

17. The integrated circuit of claim 15, wherein the clock gater circuitry of the multi-phase clock gater circuit comprises:

four or more clock gaters for gating the respective phased clock signals, each comprising an internal clock control input for receiving an internal clock control signal, and an internal clock control output for providing a version of the internal clock control signal, wherein the internal clock control input of each of the clock gaters is connected to the internal clock control output of the clock gater for a prior phase, with the internal clock control input of an initial one of the clock gaters connected to the internal clock control output of a final one of the clock gaters.

18. The integrated circuit of claim 17, wherein the each of the four or more clock gaters further comprise:

a first terminal receiving the respective phased clock signal;

a second terminal receiving a respective phase-specific version of the clock control signal;

a third terminal receiving the respective one-hot stop phase select signal;

a first combinatorial logic circuit configured to generate a latch input signal based on the respective phase-specific version of the clock control signal, and the respective one-hot stop phase select signal, and a respective internal clock control signal from a prior one of the clock gaters;

a latch circuit configured to generate the respective internal clock control signal based on the latch input signal and the respective phased clock signal; and a second combinatorial circuit configured to generate a gated version of the respective phased clock signal based on the respective internal clock control signal and the respective phased clock signal.

19. The integrated circuit of claim 18, wherein:

the first combinatorial logic circuit is configured to generate the latch input signal further based on a respective one-hot start phase select signal.

20. The integrated circuit of claim 15, wherein:

at least one of the digital circuits receiving the multi-phase clock signal is operable to select a desired phase of the clock signal with which to operate, and generate the a one-hot stop phase select signal based on the desired phase of the clock signal.

\* \* \* \* \*